(12) United States Patent
Pai et al.

(10) Patent No.: US 12,484,362 B2
(45) Date of Patent: Nov. 25, 2025

(54) DISPLAY DEVICE

(71) Applicant: AUO Corporation, Hsinchu (TW)

(72) Inventors: Chia-Hui Pai, Hsinchu (TW);
Wen-Hsien Tseng, Hsinchu (TW);
Chien-Hung Kuo, Hsinchu (TW)

(73) Assignee: AUO Corporation, Hsinchu (TW)

( * ) Notice: Subject to any disclaimer, the term of this patent is extended or adjusted under 35 U.S.C. 154(b) by 441 days.

(21) Appl. No.: 18/090,516

(22) Filed: Dec. 29, 2022

(65) Prior Publication Data
US 2024/0204037 A1 Jun. 20, 2024

(30) Foreign Application Priority Data
Dec. 14, 2022 (TW) .................................. 111148023

(51) Int. Cl.
H10H 29/14 (2025.01)
H10H 20/831 (2025.01)
H10H 20/854 (2025.01)
H10H 20/857 (2025.01)

(52) U.S. Cl.
CPC ...... H10H 29/142 (2025.01); H10H 20/8316 (2025.01); H10H 20/854 (2025.01); H10H 20/857 (2025.01)

(58) Field of Classification Search
CPC combination set(s) only.
See application file for complete search history.

(56) References Cited

U.S. PATENT DOCUMENTS

| | | | |
|---|---|---|---|
| 11,121,119 B2 | 9/2021 | Chen et al. | |
| 11,670,668 B2 | 6/2023 | Chen et al. | |
| 2010/0258822 A1* | 10/2010 | Kobayashi | H10H 20/84 257/E33.001 |
| 2018/0277591 A1* | 9/2018 | Wu | H10H 20/831 |
| 2019/0304960 A1* | 10/2019 | Ko | H01L 25/167 |
| 2019/0355704 A1* | 11/2019 | Cheng | H01L 25/167 |
| 2020/0259050 A1* | 8/2020 | Wu | H10H 20/832 |

(Continued)

FOREIGN PATENT DOCUMENTS

| | | |
|---|---|---|
| CN | 101494260 | 7/2009 |
| CN | 110600596 | 12/2019 |

(Continued)

Primary Examiner — Mark W Tornow
Assistant Examiner — Priya M Rampersaud
(74) Attorney, Agent, or Firm — JCIPRNET

(57) ABSTRACT

A display device includes a circuit substrate, a plurality of first pads, a plurality of light-emitting elements, an encapsulation layer and a conductive layer. The plurality of first pads is disposed on the circuit substrate. The plurality of light-emitting elements is disposed above the circuit substrate, and each light-emitting element includes a first electrode, a second electrode, and a light-emitting stack located between the first electrode and the second electrode, wherein the first electrodes of the plurality of light-emitting elements are disposed respectively between the light-emitting stacks of the plurality of light-emitting elements and the circuit substrate and electrically connected to the plurality of first pads respectively. The encapsulation layer is disposed on the circuit substrate and between the light-emitting elements. The conductive layer is disposed at an upper surface of the encapsulation layer and electrically connected to the second electrode.

13 Claims, 11 Drawing Sheets

(56) References Cited

U.S. PATENT DOCUMENTS

| | | | |
|---|---|---|---|
| 2020/0312813 A1 | 10/2020 | Chen et al. | |
| 2021/0066538 A1* | 3/2021 | Liu | H10H 29/142 |
| 2021/0288106 A1* | 9/2021 | Chen | H10H 20/853 |
| 2022/0037555 A1* | 2/2022 | Zhang | H10H 20/831 |
| 2022/0045123 A1* | 2/2022 | Yang | H10H 20/857 |
| 2022/0367776 A1* | 11/2022 | Kung | H01L 23/50 |
| 2023/0131224 A1 | 4/2023 | Ogawa | |

FOREIGN PATENT DOCUMENTS

| | | |
|---|---|---|
| CN | 114156305 | 3/2022 |
| CN | 114530121 | 5/2022 |
| KR | 20180135335 | 12/2018 |
| KR | 20200116027 | 10/2020 |
| TW | 202135342 | 9/2021 |
| WO | 2022000114 | 1/2022 |

\* cited by examiner

DISPLAY DEVICE

CROSS-REFERENCE TO RELATED APPLICATION

This application claims the priority benefit of Taiwan application serial no. 111148023, filed on Dec. 14, 2022. The entirety of the above-mentioned patent application is hereby incorporated by reference herein and made a part of this specification.

BACKGROUND

Technical Field

The disclosure relates to an optical device, and in particular relates to a display device.

Description of Related Art

Micro-LED display devices have the advantages of power saving, high efficiency, high brightness, and fast response time. Generally speaking, Micro-LEDs may be divided into horizontal (Lateral) and vertical (Vertical) Micro-LEDs according to the fact that their two electrodes are located on the same side or on different sides of the light-emitting stack, among them, the vertical Micro-LED is expected to become the mainstream structure in the future due to its better heat dissipation and luminous efficiency.

Since the height of the vertical Micro-LED is relatively high, and its two electrodes are located on the upper and lower sides of the light-emitting stack, after mass transferring to the circuit substrate and connecting the lower electrode of the vertical Micro-LED to the corresponding pad on the circuit substrate, a planar layer is formed to fill the terrain difference. Then the upper electrode is connect to another pad on the circuit substrate through a conductive layer. However, during the formation of the planar layer or the conductive layer, the etchant used to pattern the planar layer or the conductive layer damages the connection between the lower electrode and the corresponding pad, resulting in poor reliability of the micro-LED display device.

SUMMARY

The disclosure provides a display device with improved reliability.

An embodiment of the disclosure provides a display device, including a circuit substrate, multiple first pads, multiple light-emitting elements, an encapsulation layer, and a conductive layer. The first pads are disposed on the circuit substrate. The light-emitting elements are disposed above the circuit substrate, and each light-emitting element includes a first electrode, a second electrode, and a light-emitting stack located between the first electrode and the second electrode. The first electrodes of the light-emitting elements are respectively located between the light-emitting stacks of the light-emitting elements and the circuit substrate, and are respectively electrically connected to the first pads. The encapsulation layer is located on the circuit substrate and between the light-emitting elements. The conductive layer is disposed on an upper surface of the encapsulation layer and electrically connected to the second electrode.

In an embodiment of the disclosure, the conductive layer is a transparent conductive layer.

In an embodiment of the disclosure, the conductive layer is electrically connected to the second electrodes of the light-emitting elements.

In an embodiment of the disclosure, the conductive layer includes a plurality of conductive patterns, and the conductive patterns are respectively electrically connected to the second electrodes of the light-emitting elements.

In an embodiment of the disclosure, the display device further includes a second pad disposed on the circuit substrate and electrically connected to the conductive layer.

In an embodiment of the disclosure, the display device further includes a first transfer line, in which the second pad is located on a surface of the circuit substrate facing away from the light-emitting elements, the first transfer line is located on a first side of the circuit substrate, and the first transfer line is electrically connected to the second pad and the conductive layer.

In an embodiment of the disclosure, the first transfer line is at least partially disposed on a side surface of the encapsulation layer.

In an embodiment of the disclosure, the display device further includes a driving element and a second transfer line, in which the driving element is located on the surface of the circuit substrate facing away from the light-emitting elements, the second transfer line is located on a second side of the circuit substrate, and the second transfer line is electrically connected to the driving element and the first electrode.

In an embodiment of the disclosure, the first side is opposite to or adjacent to the second side.

In an embodiment of the disclosure, the display device further includes a driving element and a second transfer line, in which the driving element is located on the surface of the circuit substrate facing away from the light-emitting elements, the second transfer line is located on the first side of the circuit substrate, and the second transfer line is electrically connected to the driving element and the first electrode.

In an embodiment of the disclosure, the first transfer line is stepped, and a line width of the first transfer line is greater than a line width of the second transfer line.

In an embodiment of the disclosure, the first transfer line is U-shaped, and a line width of the first transfer line is substantially equal to a line width of the second transfer line.

In an embodiment of the disclosure, the first transfer line and the second transfer line are arranged alternately.

In an embodiment of the disclosure, the upper surface of the encapsulation layer is substantially flush with an upper surface of the light-emitting element.

In an embodiment of the disclosure, the encapsulation layer includes silicone, silicone resin, or epoxy resin.

In order to make the above-mentioned features and advantages of the disclosure comprehensible, embodiments accompanied with drawings are described in detail below.

DETAILED DESCRIPTION OF DISCLOSED EMBODIMENTS

Figure 1A:
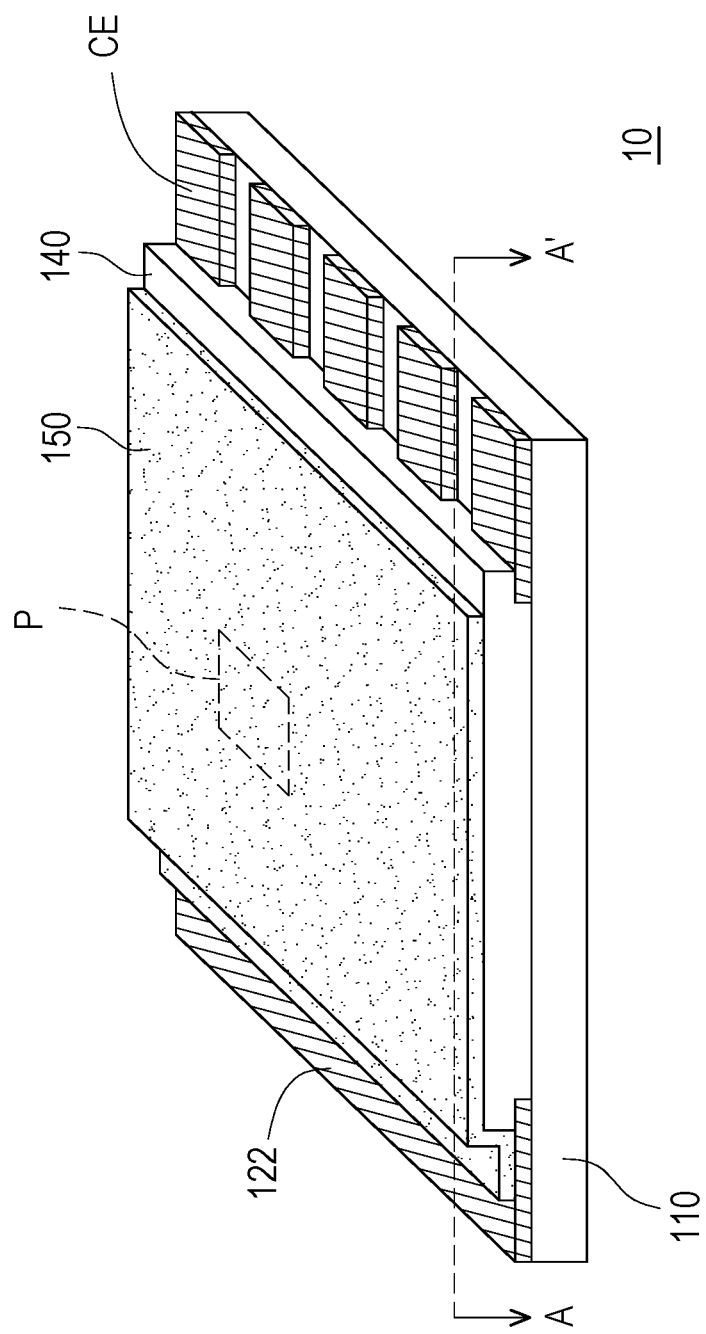
FIG. 1A is a three-dimensional schematic view of a display device 10 according to an embodiment of the disclosure.
Figure 1B:
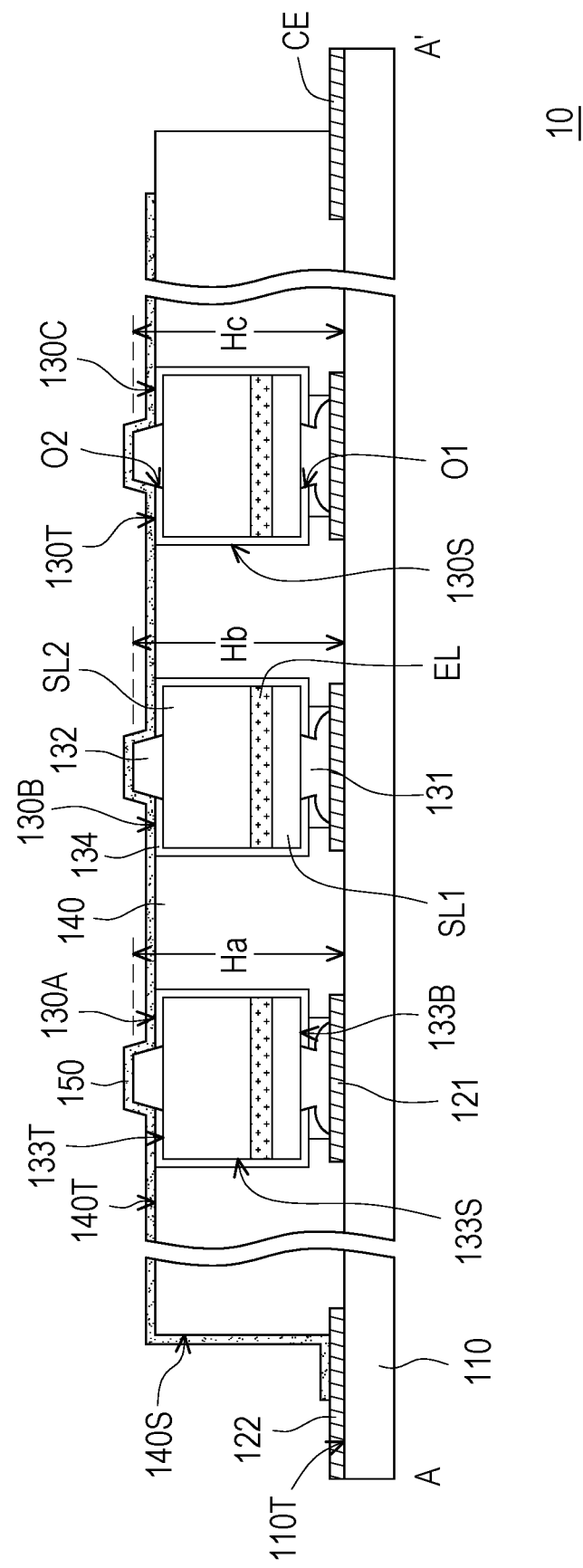
FIG. 1B is a cross-sectional schematic view along a section line A-A' of FIG. 1A.

FIG. 1A is a three-dimensional schematic view of a display device 10 according to an embodiment of the disclosure. FIG. 1B is a cross-sectional schematic view along a section line A-A' of FIG. 1A. In order to make the drawing more concise, FIG. 1A schematically shows a circuit substrate 110, an encapsulation layer 140, a conductive layer 150, a second pad 122, and connecting electrodes CE of the display device 10, and other components are omitted.

Referring to FIG. 1A to FIG. 1B, the display device 10 includes a circuit substrate 110, multiple first pads 121, multiple light-emitting elements 130, an encapsulation layer 140, and a conductive layer 150. The first pads 121 are disposed on the circuit substrate 110. The light-emitting elements 130 are disposed above the circuit substrate 110, and each light-emitting element 130 includes a first electrode 131, a second electrode 132, and a light-emitting stack 133 located between the first electrode 131 and the second electrode 132. The first electrodes 131 of the light-emitting elements 130 are located between the light-emitting stacks 133 and the circuit substrate 110, and are respectively electrically connected to the first pads 121. The encapsulation layer 140 is located on the circuit substrate 110 and between the light-emitting elements 130. The conductive layer 150 is disposed on an upper surface 140T of the encapsulation layer 140 and electrically connected to the second electrode 132 of each light-emitting element 130.

In the display device 10 according to an embodiment of the disclosure, by disposing the conductive layer 150 on the upper surface 140T of the encapsulation layer 140, the electrical connection between the first electrode 131 and the first pad 121 may be prevented from being damaged during the formation of the conductive layer 150, thereby improving the reliability of the display device 10. Hereinafter, with reference to FIG. 1A to FIG. 1B, the implementation of each element of the display device 10 will be continued to be described, but the disclosure is not limited thereto.

Specifically, the circuit substrate 110 of the display device 10 may include a driving circuit structure disposed on the bottom plate. The bottom plate may be a transparent substrate or a non-transparent substrate, and its material may be a quartz substrate, a glass substrate, a polymer substrate, or other suitable materials. The driving circuit structure may include elements or lines required by the display device 10, such as driving elements, switching elements, storage capacitors, power lines, driving signal lines, time sequence signal lines, current compensation lines, detection signal lines, and so on.

The patterns of the first pads 121 of the display device 10 may be separated from each other. In some embodiments, the first pad 121 of the display device 10 has a bulk conductive pattern, such as a rectangular bulk conductive pattern. In some embodiments, the first pad 121 has a circular bulk conductive pattern. The first pad 121 may have a single-layer structure or a multi-layer conductive material stacked structure. For example, the first pad 121 is a single metal layer of aluminum, molybdenum, titanium, copper, etc., but the disclosure is not limited thereto. In some embodiments, the first pad 121 may have a structure in which aluminum, molybdenum, titanium, copper, etc., are stacked with indium tin oxide (ITO), indium zinc oxide (IZO), indium gallium zinc oxide (IGZO), or other suitable conductive oxides.

The first electrode 131 and the second electrode 132 of the light-emitting element 130 may be respectively electrically connected to different layers in the light-emitting stack 133. For example, the light-emitting stack 133 may include a semiconductor layer SL1, a semiconductor layer SL2, and a light-emitting layer EL sandwiched between the semiconductor layer SL1 and the semiconductor layer SL2. The first electrode 131 may be electrically connected to the semiconductor layer SL1, while the second electrode 132 may be electrically connected to the semiconductor layer SL2. In some embodiments, the first electrode 131 and the second electrode 132 are respectively located on two opposite sides of the light-emitting stack 133. In other words, the light-emitting element 130 may be a vertical micro-LED. In some embodiments, the first electrode 131, the light-emitting stack 133, and the second electrode 132 of the light-emitting element 130 are arranged and stacked in a vertical direction. In some embodiments, the orthographic projection of the second electrode 132 on the circuit substrate 110 overlaps the orthographic projection of the first electrode 131 on the circuit substrate 110. In some embodiments, the orthographic projections of the first electrode 131, the second electrode 132, and the light-emitting stack 133 on the circuit substrate 110 overlap with each other.

In some embodiments, the light-emitting element 130 further includes an insulating layer 134, and the insulating layer 134 covers the side surface 133S of the light-emitting stack 133. In some embodiments, the insulating layer 134 is disposed on the side surface 133S, the top surface 133T, and the bottom surface 133B of the light-emitting stack 133. In some embodiments, the insulating layer 134 covers all surfaces of the light-emitting stack 133 and has an opening O1 and an opening O2. The opening O1 exposes the semiconductor layer SL1, and the first electrode 131 is electrically connected to the semiconductor layer SL1 through the opening O1. The opening O2 exposes the semiconductor layer SL2, and the second electrode 132 is electrically connected to the semiconductor layer SL2 through the opening O2. In some embodiments, the opening O1 is adjacent to the bottom surface 133B of the light-emitting stack 133, and the opening O2 is adjacent to the top surface 133T of the light-emitting stack 133.

In some embodiments, the materials of the first electrode 131 and the second electrode 132 include metal, alloy, nitride of metal material, oxide of metal material, nitrogen oxide of metal material, other suitable materials, stacked layers of metal materials and other conductive materials, or other low-resistance materials. In some embodiments, the material of the first electrode 131 and the second electrode 132 includes tin (Sn), tin-lead (SnPb) alloy, bismuth-tin (BiSn) alloy, and/or silver-tin (AgSn) alloy. In some embodiments, the material of the second electrode 132 includes indium tin oxide (InSnO), indium zinc oxide (InZnO), aluminum tin oxide (AlSnO), aluminum zinc oxide (AlZnO), indium gallium zinc oxide (InGaZnO), nano silver, or other suitable conductive oxides.

In some embodiments, the semiconductor layer SL1 is an N-type doped semiconductor layer, and the material of the N-type doped semiconductor layer is, for example, N-type gallium nitride (n-GaN). In other embodiments, the semiconductor layer SL1 may include group II-VI materials (e.g., zinc selenide (ZnSe)) or group III-V nitride materials (e.g., gallium nitride (GaN), aluminum nitride (AlN), indium nitride (InN), indium gallium nitride (InGaN), aluminum gallium nitride (AlGaN), or aluminum indium gallium nitride (AlInGaN)). In some embodiments, the semiconductor layer SL2 is a P-type doped semiconductor layer, and the material of the P-type doped semiconductor layer is, for example, P-type gallium nitride (p-GaN). In other embodiments, the semiconductor layer SL2 may include group II-VI materials (e.g., zinc selenide (ZnSe)) or group III-V nitride materials (e.g., gallium nitride (GaN), aluminum nitride (AlN), indium nitride (InN), indium gallium nitride (InGaN), aluminum gallium nitride (AlGaN), or aluminum indium gallium nitride (AlInGaN)). In some embodiments, the light-emitting layer EL may include group II-VI materials (e.g., zinc selenide (ZnSe)) or group III-V nitride materials (e.g., gallium nitride (GaN), aluminum nitride (AlN), indium nitride (InN), indium gallium nitride (InGaN), aluminum gallium nitride (AlGaN), or aluminum indium gallium nitride (AlInGaN)). In some embodiments, the structure of the light-emitting layer EL is, for example, a multiple quantum well (MQW) structure. The multiple quantum well structure may include alternately stacked layers of indium gallium nitride (InGaN) and gallium nitride (GaN), by designing the proportion of indium or gallium in the light-emitting layer EL, the emission wavelength range of the light-emitting layer EL may be adjusted.

For example, the light-emitting element 130 is manufactured on a growth substrate (e.g., a sapphire substrate) and then transferred to the circuit substrate 110 through a mass transfer process, and the first electrode 131 of the light-emitting element 130 may be transferred onto the first pad 121. In some embodiments, the first electrode 131 is located between the first pad 121 and the light-emitting stack 133. In some embodiments, the orthographic projections of the first pad 121, the first electrode 131, and the light-emitting stack 133 on the circuit substrate 110 overlap with each other. In some embodiments, the orthographic projection of the second electrode 132 on the circuit substrate 110 overlaps the orthographic projection of the first pad 121 on the circuit substrate 110. In some embodiments, the orthographic projections of the first pad 121, the first electrode 131, the light-emitting stack 133, and the second electrode 132 on the circuit substrate 110 overlap with each other. In some embodiments, the first electrode 131 may also be electrically connected to the first pad 121 through metal, conductive adhesive, or other conductive materials (e.g., tin-lead (SnPb) alloys, bismuth-tin (BiSn) alloys, silver-tin (AgSn) alloys, or other solders).

In some embodiments, the light-emitting elements 130 of the display device 10 include a light-emitting element 130A, a light-emitting element 130B, and a light-emitting element 130C, and the height Ha, the height Hb, and the height Hc of the light-emitting element 130A, the light-emitting element 130B, and the light-emitting element 130C on the circuit substrate 110 are similar to each other. In some embodiments, the height Ha, the height Hb, and the height Hc are substantially equal to each other. In some embodiments, the light-emitting element 130A, the light-emitting element 130B, and the light-emitting element 130C are all blue light-emitting diodes, and the display device 10 further includes a color conversion layer (not shown) respectively disposed on the light-emitting element 130B and the light-emitting element 130C. The color conversion layer may include phosphor powder or similar wavelength conversion material to convert the blue light emitted by the blue light-emitting diode into light of different colors to achieve a full-color display effect. In other embodiments, the light-emitting element 130A may be a blue light-emitting diode, the light-emitting element 130B may be a red light-emitting diode, and the light-emitting element 130C may be a green light-emitting diode, thereby achieving a full-color display effect. When the emitted colors of the light-emitting element 130A, the light-emitting element 130B, and the light-emitting element 130C are different from each other, the aforementioned color conversion layer may be selectively omitted or remain in the display device 10. In some embodiments, the light-emitting element 130A, the light-emitting element 130B, and the light-emitting element 130C may all be white light-emitting diodes, and the color conversion layer may be a color filter layer to achieve a full-color display effect.

The encapsulation layer 140 of the display device 10 may be located on the circuit substrate 110 and fill the space between the light-emitting elements 130. In some embodiments, the encapsulation layer 140 covers the side surface 130S of each light-emitting element 130. In some embodiments, the encapsulation layer 140 physically contacts the side surface 130S of the light-emitting element 130. For example, the insulating layer 134 of the light-emitting element 130 is located between the encapsulation layer 140 and the side surface 133S of the light-emitting stack 133. In some embodiments, the upper surface 140T of the encapsulation layer 140 is substantially flush with the upper surface 130T of the light-emitting element 130. For example, the material of the encapsulation layer 140 may include encapsulation materials such as silicone, silicone resin, or epoxy resin, but the disclosure is not limited thereto.

In some embodiments, the display device 10 further includes a second pad 122, and the conductive layer 150 electrically connects the second electrode 132 of the light-emitting element 130 to the second pad 122. In some embodiments, the second pad 122 is disposed on the upper surface 110T of the circuit substrate 110. In some embodiments, the conductive layer 150 extends on the upper surface 140T of the encapsulation layer 140, and extends to the second pad 122 along the side surface 140S of the encapsulation layer 140. In some embodiments, the conductive layer 150 is a continuously extending transparent conductive layer, and the conductive layer 150 is electrically connected to the second electrodes 132 of the light-emitting elements 130. The conductive layer 150 may be a transparent conductive layer. For example, the material of the conductive layer 150 includes indium tin oxide (InSnO), indium zinc oxide (InZnO), aluminum tin oxide (AlSnO), aluminum zinc oxide (AlZnO), indium gallium zinc oxide (InGaZnO), nano silver, or other suitable conductive oxides.

In some embodiments, the second pad 122 may be a common electrode, and the second electrodes 132 of the light-emitting elements 130 are all electrically connected to the second pad 122 to have the same electric potential. In some embodiments, the second pad 122 has a single-layer structure or a multi-layer conductive material stacked structure. For example, the second pad 122 is a single metal layer of aluminum, molybdenum, titanium, copper, etc., but the disclosure is not limited thereto. In some embodiments, the second pad 122 may have a structure in which aluminum, molybdenum, titanium, copper, etc., are stacked with indium tin oxide (ITO), indium zinc oxide (IZO), indium gallium zinc oxide (IGZO), or other suitable conductive oxides. In some embodiments, the structure or material of the second pad 122 may be the same as that of the first pad 121.

In some embodiments, the first pad 121 and the second pad 122 may belong to different film layers or be located on different planes. In some embodiments, the first pad 121 and the second pad 122 may belong to the same film layer or be located on the same plane, and the patterns of the first pad 121 and the second pad 122 are separated from each other. In some embodiments, the first pad 121 and the second pad 122 may have different electric potentials.

The display device 10 may be manufactured through the following steps, but the disclosure is not limited thereto. Firstly, the first pad 121 and the second pad 122 are formed on the upper surface 110T of the circuit substrate 110. In some embodiments, the first pad 121 and the second pad 122 may be formed by the same process steps. In some embodiments, during the process of forming the first pad 121 and the second pad 122, the connecting electrodes CE are also formed on the upper surface 110T of the circuit substrate 110, and the connecting electrodes CE are electrically connected to the first pads 12. The connecting electrodes CE may be used to electrically connect the first pads 121 to, for example, a driving element or a control element of the display device 10.

Next, multiple light-emitting elements 130 are formed above the circuit substrate 110. For example, multiple light-emitting elements 130 may be transferred onto a carrier by a mass transferring process, and then the light-emitting elements 130 are respectively placed on the first pads 121 using methods such as pick-up bonding or direct bonding, so that the first electrode 131 of the light-emitting element 130 overlaps the corresponding first pad 121.

Next, heat treatment, such as infrared laser treatment, may be performed to electrically connect the first electrodes 131 to the first pads 121. In some embodiments, after the heat treatment, a eutectic layer electrical connection structure is formed between the first electrode 131 and the first pad 121.

Next, an encapsulation layer 140 may be formed on the circuit substrate 110 and between the light-emitting elements 130. In some embodiments, the encapsulation layer 140 may be formed by processes such as compressive molding, transfer molding, and liquid encapsulant molding. For example, a metal mask may be used to cover at least a portion of the second pad 122 and at least a portion of the connecting electrodes CE, and then the liquid encapsulant material is distributed on the circuit substrate 110, such as the space between the light-emitting elements 130, but the encapsulant is not distributed on the second electrodes 132 of the light-emitting elements 130, and then the encapsulant is cured to form the encapsulation layer 140, where the encapsulation layer 140 cover the first electrode 131, the first pad 121, and the electrical connection structure therebetween, such as a eutectic layer. In this way, during the subsequent etching process to pattern the conductive layer 150, the encapsulation layer 140 may protect the first electrode 131, the first pad 121, and the electrical connection structure therebetween (e.g., the aforementioned eutectic layer) from being damaged by the etching process. In addition, although the encapsulation layer 140 shown in FIG. 1B is only located between the side surfaces 130S of adjacent light-emitting elements 130, the disclosure is not limited thereto. In some embodiments, the encapsulation layer 140 further extends to the upper surface 130T of the light-emitting element 130, but the encapsulation layer 140 does not completely cover the second electrode 132. In other words, at least a portion of the second electrode 132 may still be exposed by the encapsulation layer 140.

Next, the conductive layer 150 may be formed on the upper surface 140T of the encapsulation layer 140, the second electrode 132 of the light-emitting element 130, and the second pad 122, so that the conductive layer 150 may electrically connect the second electrode 132 to the second pad 122. In the process of forming the conductive layer 150, the connecting electrode CE may be covered using a metal mask to prevent the conductive layer 150 from being electrically connected to the connecting electrode CE.

Hereinafter, other embodiments of the disclosure will be described with reference to FIG. 2A to FIG. 6B, and the reference numbers and related contents of the embodiments of FIG. 1A to FIG. 1B will be used. The same or similar reference numerals are used to denote the same or similar elements, and the description of the same technical content is omitted. For the description of the omitted part, reference may be made to the embodiments of FIG. 1A to FIG. 1B, which will not be repeated in the following description.

Figure 2A:
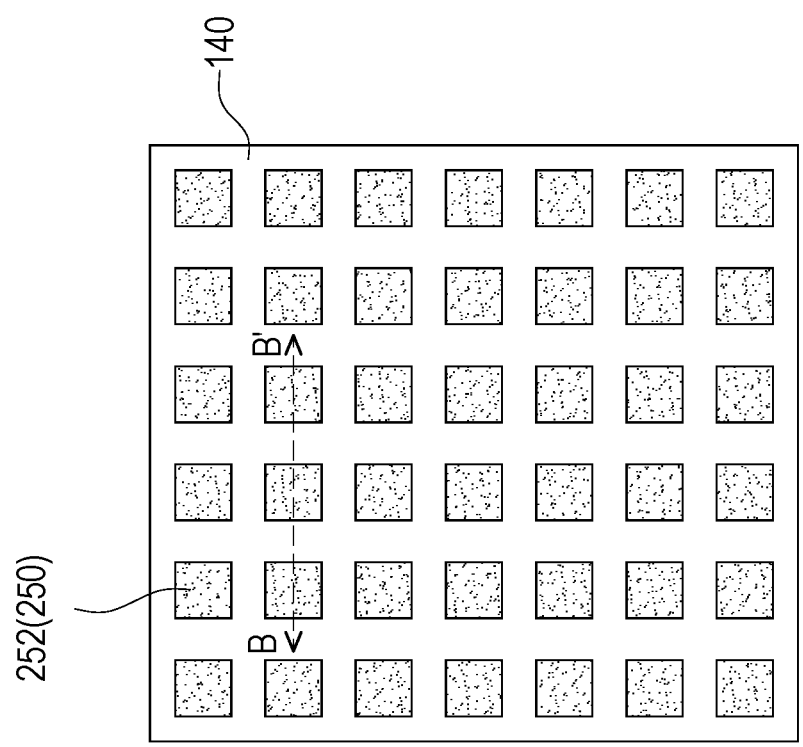
FIG. 2A is a partial top schematic view of a display device 20 according to an embodiment of the disclosure.
Figure 2B:
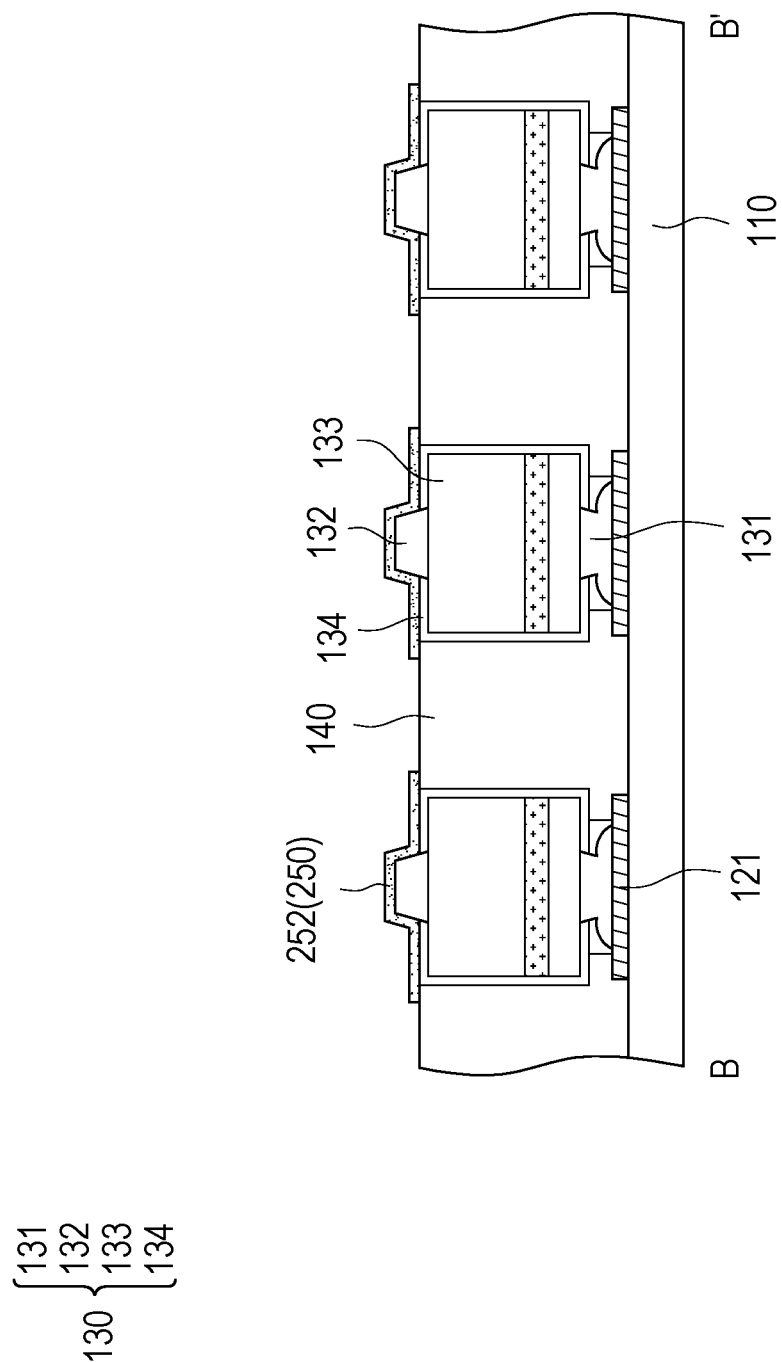
FIG. 2B is a cross-sectional schematic view along a section line B-B' of FIG. 2A.

FIG. 2A is a partial top schematic view of a display device 20 according to an embodiment of the disclosure. In some embodiments, FIG. 2A is an enlarged schematic view of region P of FIG. 1A. FIG. 2B is a cross-sectional schematic view along a section line B-B' of FIG. 2A. The display device 20 includes: a circuit substrate 110, multiple first pads 121, multiple light-emitting elements 130, an encapsulation layer 140, and a conductive layer 250. Each light-emitting element 130 includes a first electrode 131, a second electrode 132, a light-emitting stack 133, and an insulating layer 134. The light-emitting stack 133 is located between the first electrode 131 and the second electrode 132, the first electrode 131 is located between the light-emitting stack 133 and the circuit substrate 110, and the first electrode 131 is electrically connected to the first pad 121. The encapsulation layer 140 is located on the circuit substrate 110 and between the light-emitting elements 130. The conductive layer 250 is disposed on the encapsulation layer 140 and electrically connected to the second electrodes 132 of each light-emitting element 130.

Compared with the display device 10 shown in FIG. 1A to FIG. 1B, the differences of the display device 20 shown in FIG. 2A to FIG. 2B are mainly that the conductive layer 250 of the display device 20 includes multiple conductive patterns 252, and the conductive patterns 252 are respectively electrically connected to the second electrodes 132 of the light emitting elements 130. For example, a patterning process (e.g., an etching process) may be performed on the aforementioned conductive layer 150 to form the conductive layer 250 including the conductive patterns 252. Since the encapsulation layer 140 has covered the electrical connection structure between the first electrode 131 and the first pad 121, the encapsulation layer 140 may prevent the etchant from damaging the electrical connection between the first electrode 131 and the first pad 121 during the etching process of the conductive layer.

Figure 3:
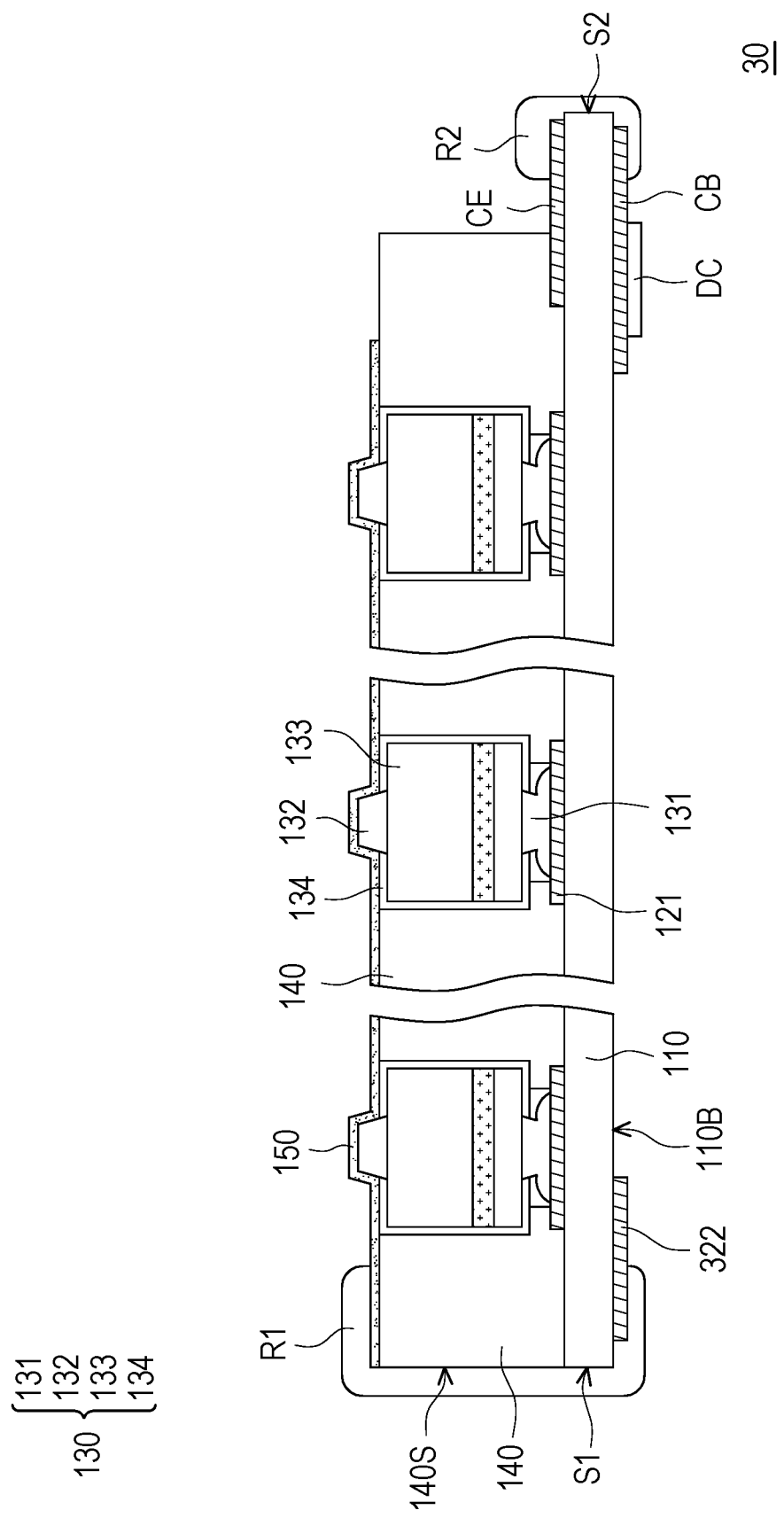
FIG. 3 is a partial cross-sectional schematic view of a display device 30 according to an embodiment of the disclosure.

FIG. 3 is a partial cross-sectional schematic view of a display device 30 according to an embodiment of the disclosure. The display device 30 includes a circuit substrate 110, a first pad 121, a light-emitting element 130, an encapsulation layer 140, a conductive layer 150, a second pad 322, and a connecting electrode CE. Each light-emitting element 130 includes a first electrode 131, a second electrode 132, a light-emitting stack 133, and an insulating layer 134. The first electrode 131 is electrically connected to the first pad 121, and the first pad 121 is electrically connected to the connecting electrode CE. The encapsulation layer 140 is located on the circuit substrate 110 and between the light-emitting elements 130. The conductive layer 150 is disposed on the encapsulation layer 140 and electrically connected to the second electrodes 132 of each light-emitting element 130.

Compared with the display device 10 shown in FIG. 1A to FIG. 1B, the difference of the display device 30 shown in FIG. 3 is mainly that the second pad 322 is located on the lower surface 110B of the circuit substrate 110 facing away from the light-emitting elements 130, and the display device 30 further includes a first transfer line R1 located on the side S1 of the circuit substrate 110. In this way, the conductive layer 150 may be electrically connected to the second pad 322 through the first transfer line R1. In some embodiments, the first transfer line R1 is at least partially disposed on the side surface 140S of the encapsulation layer 140. In some embodiments, the second pad 322 is located on a side of the lower surface 110B close to the side S1. In some embodiments, the first transfer line R1 has a U-shaped profile, and the first transfer line R1 extends from the upper surface of the conductive layer 150 to the second pad 322 along the side surface 140S of the encapsulation layer 140 and the lower surface 110B of the circuit substrate 110, so that the second electrode 132 may be electrically connected to the second pad 322 through the conductive layer 150 and the first transfer line R1.

In some embodiments, the display device 30 further includes a driving element DC and a second transfer line R2. The driving element DC is located on the lower surface 110B of the circuit substrate 110 facing away from the light-emitting elements 130, and the second transfer line R2 is located on the side S2 of the circuit substrate 110. In some embodiments, the driving element DC is located on a side of the lower surface 110B close to the side S2. In some embodiments, the side S2 of the circuit substrate 110 is opposite to the side S1. In some embodiments, the side S2 of the circuit substrate 110 is adjacent to the side S1.

For example, the display device 30 may include multiple sub-pixels, and each sub-pixel may include a first pad 121, a light-emitting element 130, an encapsulation layer 140, a conductive layer 150, and a second pad 322. A driving element DC may be respectively electrically connected to the first pad 121 and the second pad 322 to individually control the operation of each sub-pixel. In some embodiments, multiple first pads 121 are separated from each other and independently receive signals provided by the driving element DC. In some embodiments, the display device 30 may include a single second pad 322 as a common electrode. In some embodiments, the display device 30 may include multiple second pads 322, and the second pads 322 may be electrically connected to each other or applied with the same common voltage during operation. In some embodiments, the driving element DC may be a chip bonded to the circuit substrate 110 or a circuit element (including an active element, a passive element, or a combination thereof) directly formed in the circuit substrate 110.

The second transfer line R2 may have a U-shaped profile, and the second transfer line R2 may extend from the upper surface of the connecting electrode CE to the lower surface 110B of the circuit substrate 110 along the side surface of the circuit substrate 110, so that the first electrode 131 may be electrically connected to the driving element DC through the first pad 121, the connecting electrode CE, and the second transfer line R2.

In some embodiments, the display device 30 further includes a chip bonding layer CB located on the lower surface 110B of the circuit substrate 110, and the driving element DC may be disposed on the chip bonding layer CB and electrically connected to the chip bonding layer CB. In addition, the second transfer line R2 may be further electrically connected to the chip bonding layer CB, so as to be electrically connected to the driving element DC through the chip bonding layer CB.

Figure 4A:
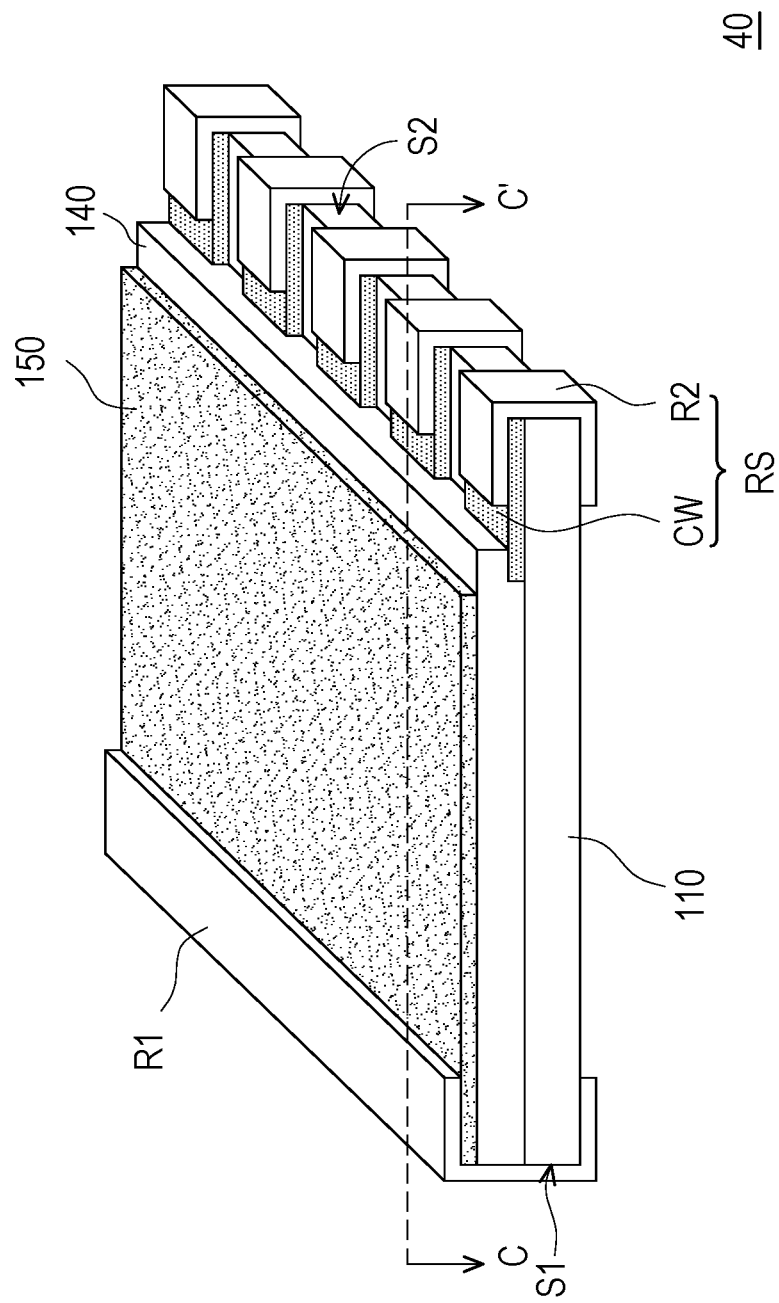
FIG. 4A is a three-dimensional schematic view of a display device 40 according to an embodiment of the disclosure.
Figure 4B:
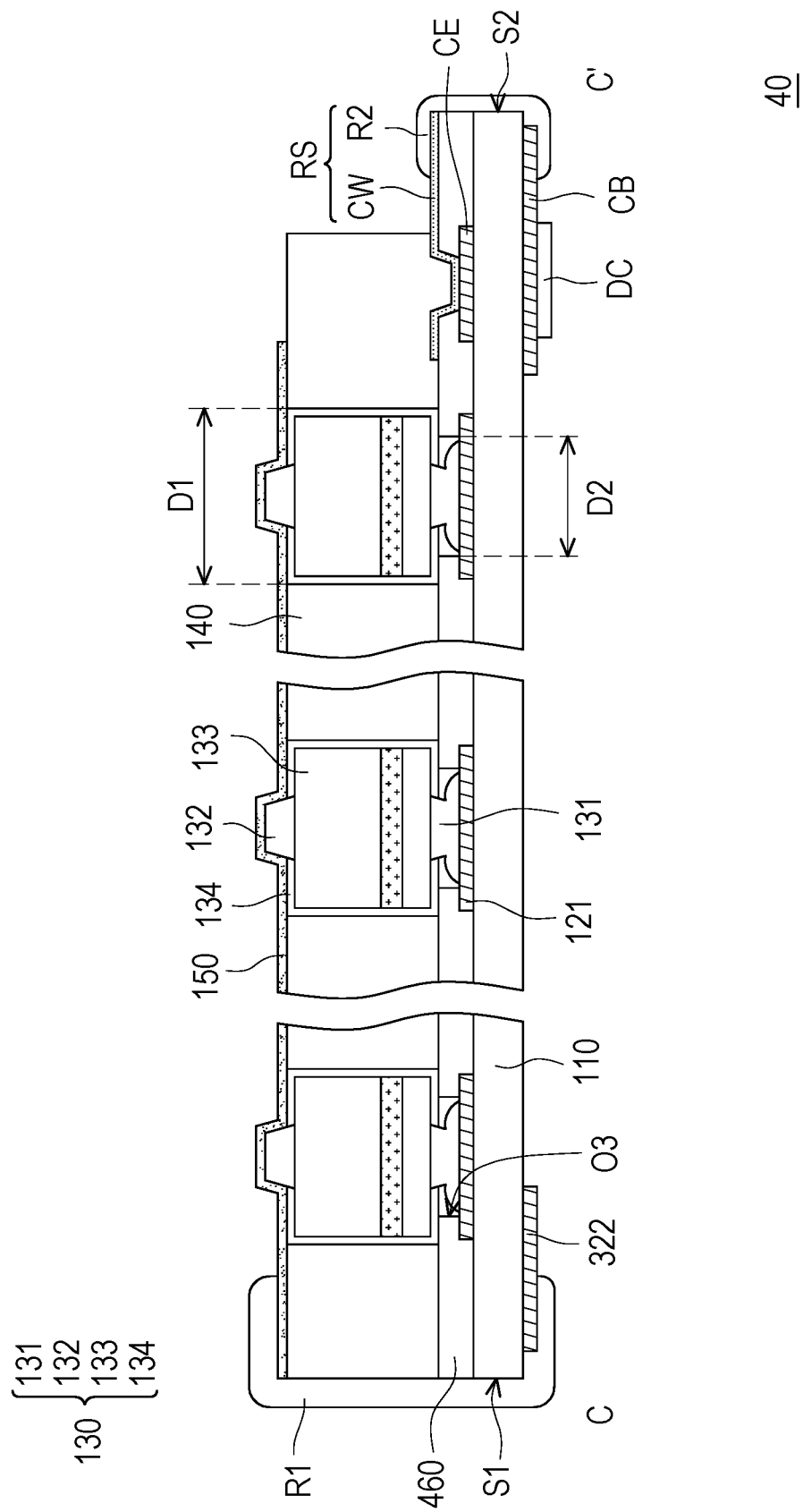
FIG. 4B is a cross-sectional schematic view along a section line C-C' of FIG. 4A.

FIG. 4A is a three-dimensional schematic view of a display device 40 according to an embodiment of the disclosure. FIG. 4B is a cross-sectional schematic view along a section line C-C' of FIG. 4A. The display device 40 includes a circuit substrate 110, multiple first pads 121, multiple light-emitting elements 130, an encapsulation layer 140, a conductive layer 150, a second pad 322, a connecting electrode CE, a first transfer line R1, a second transfer lines R2, a chip bonding layer CB, and a driving element DC. Each light-emitting element 130 includes a first electrode 131, a second electrode 132, a light-emitting stack 133, and an insulating layer 134. The first electrode 131 is electrically connected to the first pad 121, and the second electrode 132 is electrically connected to the second pad 322. The encapsulation layer 140 is located on the circuit substrate 110 and between the light-emitting elements 130. The conductive layer 150 is disposed on the encapsulation layer 140 and electrically connected to the second electrodes 132 of each light-emitting element 130.

Compared with the display device 30 shown in FIG. 3, the differences of the display device 40 shown in FIG. 4A to FIG. 4B are mainly that the display device 40 further includes an insulating layer 460, and the insulating layer 460 may be located between the light-emitting stack 133 of the light-emitting element 130 and the circuit substrate 110. In addition, the insulating layer 460 may have multiple openings O3, and multiple first pads 121 are respectively disposed in the openings O3.

In some embodiments, the insulating layer 460 may cover a portion of each first pad 121, for example, the insulating layer 460 may cover a side of each first pad 121. In some embodiments, the insulating layer 460 may be located between the insulating layer 134 of the light-emitting element 130 and the circuit substrate 110. In some embodiments, the insulating layer 460 may be located between the encapsulation layer 140 and the circuit substrate 110. In some embodiments, the width D1 of the light-emitting element 130 is not smaller than the diameter D2 of the opening O3, for example, the width D1 is larger than the diameter D2. In some embodiments, the light-emitting stack 133 and the insulating layer 134 are located outside the opening O3, and the light-emitting stack 133 or the insulating layer 134 is attached to the upper surface of the insulating layer 460.

In some embodiments, the display device 40 further includes a connecting wire CW. The connecting wire CW may electrically connect the second transfer line R2 and the connecting electrode CE. In some embodiments, the display device 40 includes multiple connecting wires CW and multiple second transfer lines R2, and the connecting wires CW are respectively electrically connected to the corresponding second transfer lines R2 to form multiple sets of transfer electrical connection structures RS. In other words, each set of transfer electrical connection structures RS includes connecting wires CW and second transfer lines R2 electrically connected to each other. In some embodiments, the multiple sets of transfer electrical connection structures RS are separated from each other, and the multiple sets of transfer electrical connection structures RS are all electrically connected to the driving element DC.

Figure 5A:
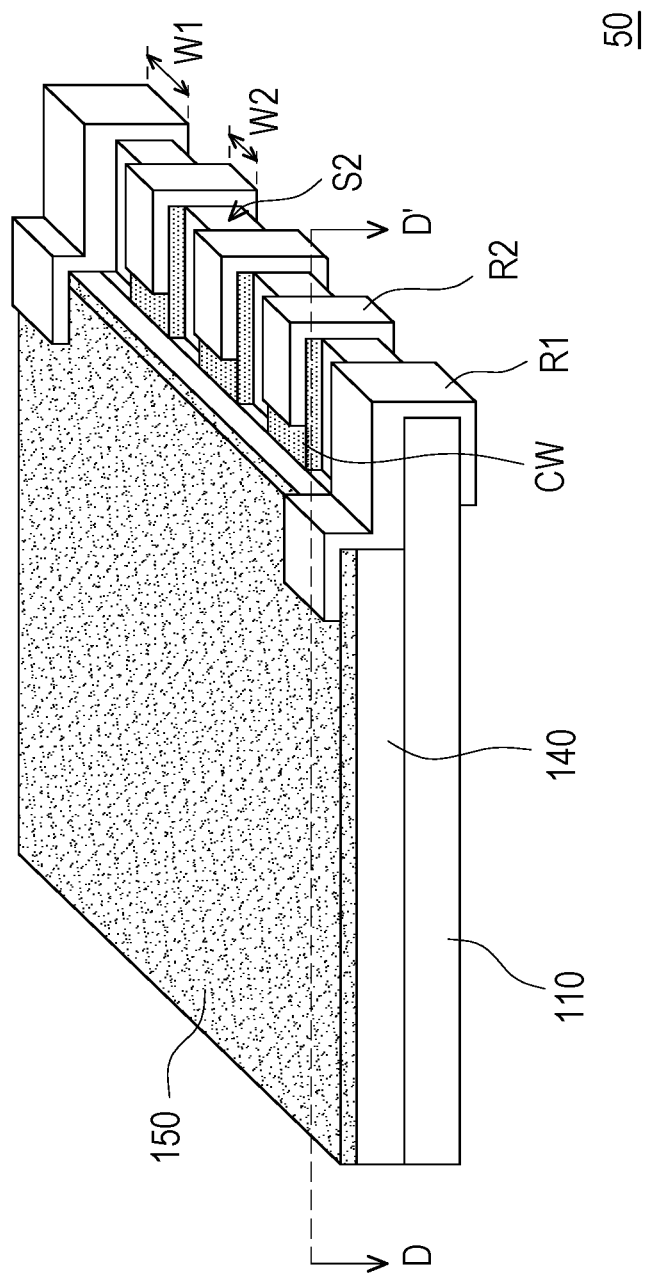
FIG. 5A is a three-dimensional schematic view of a display device 50 according to an embodiment of the disclosure.
Figure 5B:
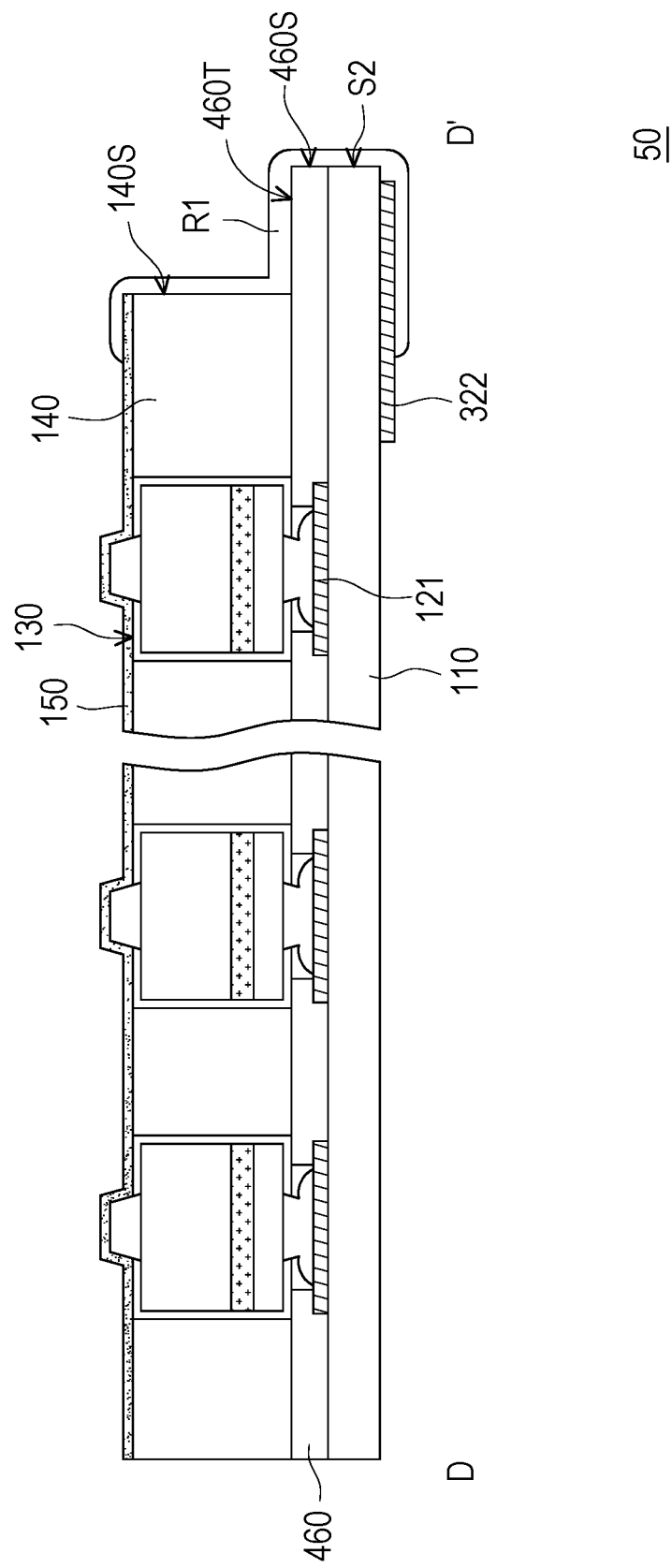
FIG. 5B is a cross-sectional schematic view along a section line D-D' of FIG. 5A.

FIG. 5A is a three-dimensional schematic view of a display device 50 according to an embodiment of the disclosure. FIG. 5B is a cross-sectional schematic view along a section line D-D' of FIG. 5A. The display device 50 includes a circuit substrate 110, multiple first pads 121, multiple light-emitting elements 130, an encapsulation layer 140, a conductive layer 150, a second pad 322, a connecting wire CW, a first transfer line R1, and a second transfer line R2.

Compared with the display device 40 shown in FIG. 4A to FIG. 4B, the differences of the display device 50 shown in FIG. 5A to FIG. 5B are mainly that the first transfer line R1 and the second transfer line R2 of the display device 50 are located on the same side of the display device 50, in this way, the splicing of multiple display devices 50 may be facilitated.

For example, in this embodiment, both the first transfer line R1 and the second transfer line R2 are disposed on the side S2 of the circuit substrate 110, and the first transfer line R1 extends along the side surface 140S of the encapsulation layer 140, the upper surface 460T and the side surface 460S of the insulating layer 460, and the side S2 of the circuit substrate 110, and electrically connects the conductive layer 150 to the second pad 322. In some embodiments, the line width W1 of the first transfer line R1 is greater than the line width W2 of the second transfer line R2, so as to further reduce the impedance of the stepped first transfer line R1. In some embodiments, the display device 50 includes multiple first transfer lines R1 and multiple second transfer lines R2. For example, the display device 50 includes two first transfer lines R1 and three second transfer lines R2, and the two first transfer lines R1 are respectively located on both sides of the three second transfer lines R2, but the disclosure is not limited thereto. In some embodiments, the display device 50 further includes multiple second pads 322, and multiple first transfer lines R1 are respectively electrically connected to the second pads 322.

Figure 6A:
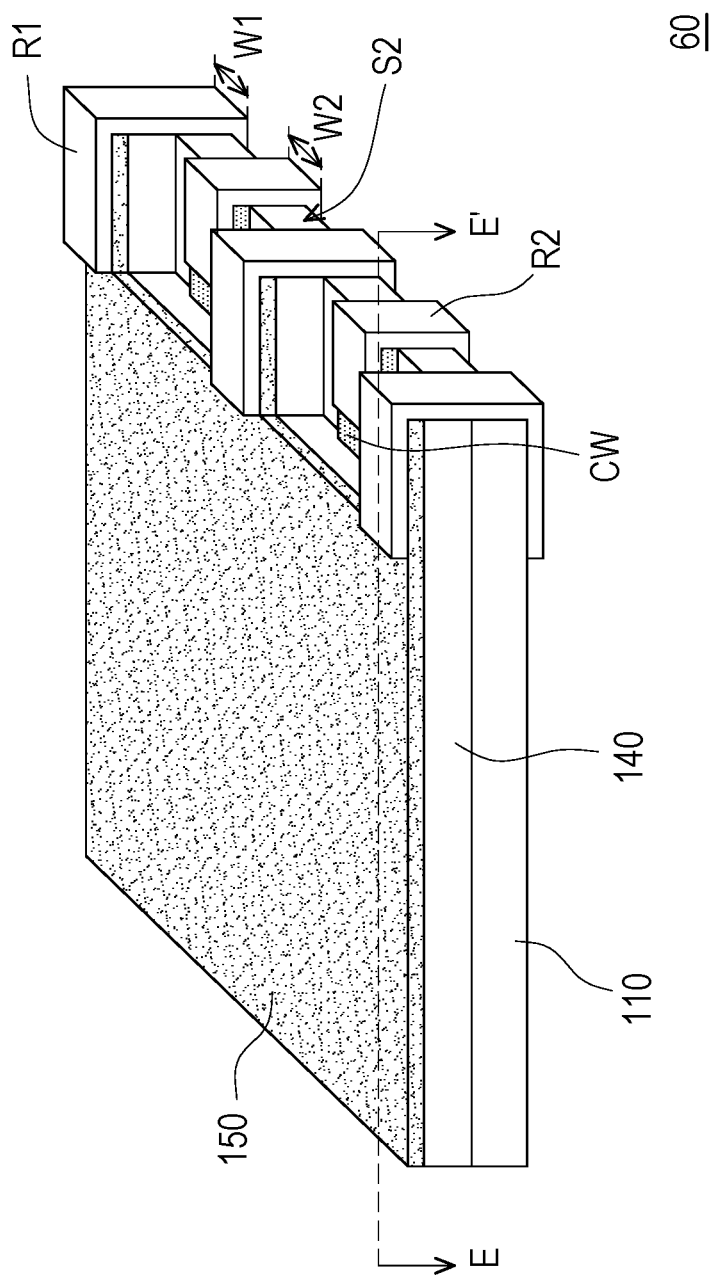
FIG. 6A is a three-dimensional schematic view of a display device 60 according to an embodiment of the disclosure.
Figure 6B:
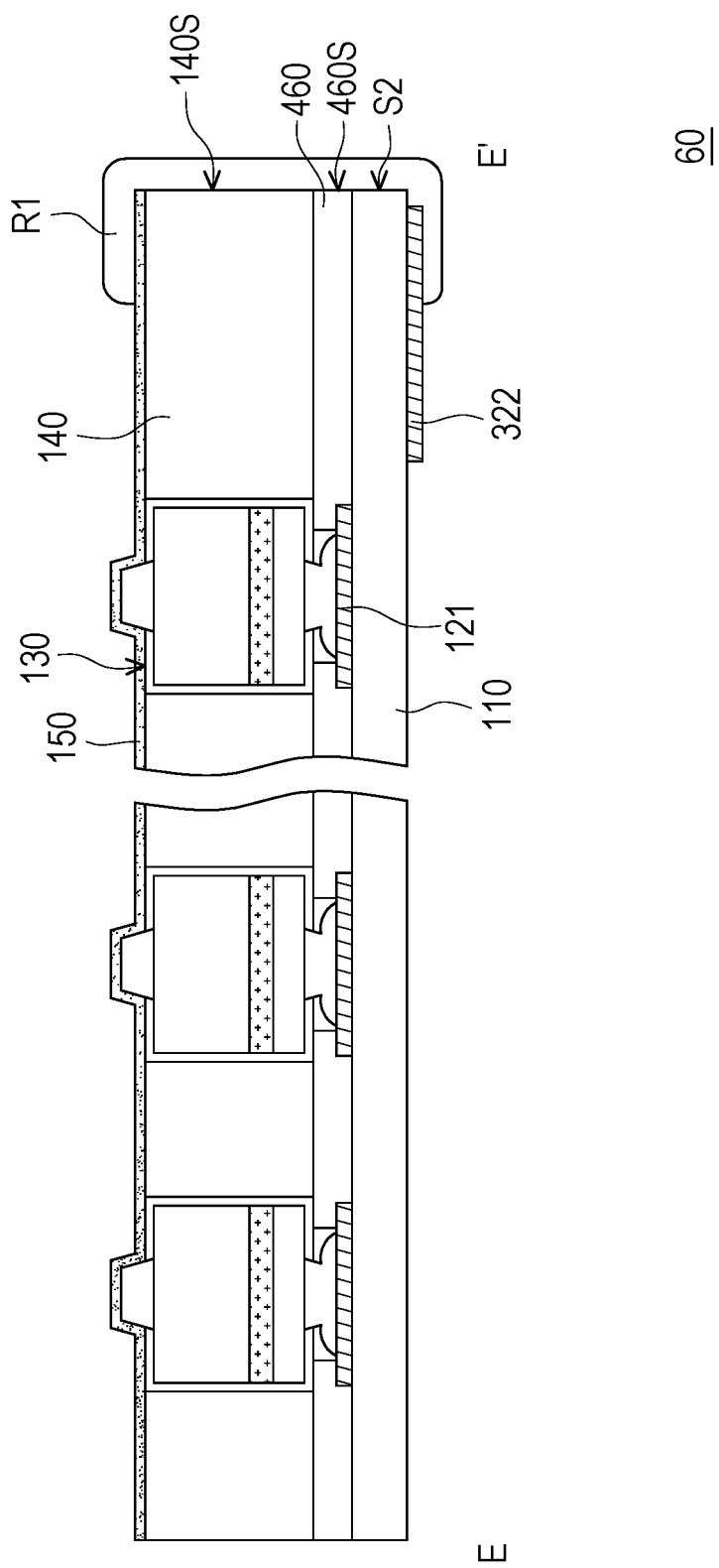
FIG. 6B is a cross-sectional schematic view along a section line E-E' of FIG. 6A.

FIG. 6A is a three-dimensional schematic view of a display device 60 according to an embodiment of the disclosure. FIG. 6B is a cross-sectional schematic view along a section line E-E' of FIG. 6A. The display device 60 includes a circuit substrate 110, multiple first pads 121, multiple light-emitting elements 130, an encapsulation layer 140, a conductive layer 150, a second pad 322, a connecting wire CW, a first transfer line R1, and a second transfer line R2.

Compared with the display device 50 shown in FIG. 5A to FIG. 5B, the differences of the display device 60 shown in FIG. 6A to FIG. 6B are mainly that at the location where the first transfer line R1 is disposed, the encapsulation layer 140 and the conductive layer 150 of the display device 60 may partially extend to the side S2 of the circuit substrate 110 so that the side surface 140S of the encapsulation layer 140 is substantially flush with the side surface 460S of the insulating layer 460 and the side S2 of the circuit substrate 110. The first transfer line R1 may extend vertically downward from the conductive layer 150 located on the upper surface 110T of the circuit substrate 110 along the side surface 140S of the encapsulation layer 140, the side surface 460S of the insulating layer 460, and the side S2 of the circuit substrate 110. Then, the first transfer line R1 may extend to the lower surface 110B of the circuit substrate 110 to electrically connect the conductive layer 150 to the second pad 322. In some embodiments, the first transfer line R1 has a U-shaped profile, and the line width W1 of the first transfer line R1 is similar to the line width W2 of the second transfer line R2. In some embodiments, the line width W1 of the first transfer line R1 is substantially equal to the line width W2 of the second transfer line R2. In some embodiments, the first transfer lines R1 and the second transfer lines R2 are arranged alternately.

To sum up, in the display device of the present invention, the first electrode, the first pad, and the electrical connection structure therebetween are protected by the encapsulation layer, and the conductive layer is disposed on the upper surface of the encapsulation layer, so that the first electrode, the first pad, and the electrical connection structure therebetween may be prevented from being damaged during the process of forming the conductive layer, thereby improving the reliability of the display device.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A display device, comprising:
   a circuit substrate;
   a plurality of first pads, disposed on the circuit substrate;
   a plurality of light-emitting elements, disposed above the circuit substrate, and each of the light-emitting elements comprising: a first electrode, a second electrode, and a light-emitting stack located between the first electrode and the second electrode, wherein the first electrodes of the light-emitting elements are respectively located between the light-emitting stacks of the light-emitting elements and the circuit substrate, and are respectively electrically connected to the first pads;
   an encapsulation layer, located on the circuit substrate and between the light-emitting elements;
   a conductive layer, disposed on an upper surface of the encapsulation layer and electrically connected to the second electrode;
   a second pad disposed on the circuit substrate and electrically connected to the conductive layer; and
   a first transfer line, wherein the second pad is located on a surface of the circuit substrate facing away from the light-emitting elements, wherein the first transfer line is located on a first side of the circuit substrate, and the first transfer line is electrically connected to the second pad and the conductive layer.

2. The display device according to claim 1, wherein the conductive layer is a transparent conductive layer.

3. The display device according to claim 1, wherein the conductive layer is electrically connected to the second electrodes of the light-emitting elements.

4. The display device according to claim 1, wherein the conductive layer comprises a plurality of conductive patterns, and the conductive patterns are respectively electrically connected to the second electrodes of the light-emitting elements.

5. The display device according to claim 1, wherein the first transfer line is at least partially disposed on a side surface of the encapsulation layer.

6. The display device according to claim 1, further comprising a driving element and a second transfer line, wherein the driving element is located on the surface of the circuit substrate facing away from the light-emitting elements, the second transfer line is located on a second side of the circuit substrate, and the second transfer line is electrically connected to the driving element and the first electrode.

7. The display device according to claim 6, wherein the first side is opposite to or adjacent to the second side.

8. The display device according to claim 1, further comprising a driving element and a second transfer line, wherein the driving element is located on the surface of the circuit substrate facing away from the light-emitting elements, the second transfer line is located on the first side of the circuit substrate, and the second transfer line is electrically connected to the driving element and the first electrode.

9. The display device according to claim 8, wherein the first transfer line is stepped, and a line width of the first transfer line is greater than a line width of the second transfer line.

10. The display device according to claim 8, wherein the first transfer line is U-shaped, and a line width of the first transfer line is substantially equal to a line width of the second transfer line.

11. The display device according to claim 8, wherein the first transfer line and the second transfer line are arranged alternately.

12. The display device according to claim 1, wherein the upper surface of the encapsulation layer is substantially flush with an upper surface of the light-emitting elements.

13. The display device according to claim 1, wherein the encapsulation layer comprises silicone, silicone resin, or epoxy resin.

* * * * *